(12) United States Patent
Bergmann et al.

(10) Patent No.: US 6,777,855 B2
(45) Date of Patent: Aug. 17, 2004

(54) SURFACE WAVE CONVERTER WITH OPTIMIZED REFLECTION

(75) Inventors: Andreas Bergmann, Haiming (DE); Jurgen Franz, Frankfurt am Main (DE)

(73) Assignee: Epcos AG, Munich ( * ) Notice: Subject to any disclaimer, the term of this patent is extended or adjusted under 35 U.S.C. 154(b) by 0 days.

(21) Appl. No.: 10/204,103

(22) PCT Filed: Feb. 19, 2001

(86) PCT No.: PCT/DE01/00630

§ 371 (c)(1),
(2), (4) Date: Aug. 15, 2002

(87) PCT Pub. No.: WO01/65688

PCT Pub. Date: Sep. 7, 2001

(65) Prior Publication Data

US 2003/0057805 A1 Mar. 27, 2003

(30) Foreign Application Priority Data

Mar. 2, 2000 (DE) .......................... 100 10 089

(51) Int. Cl.[7] .............................................. H01L 41/08
(52) U.S. Cl. .................................................. 310/313 B
(58) Field of Search ........................ 310/313 A–313 C, 310/313 R; 333/193

(56) References Cited

U.S. PATENT DOCUMENTS

| | | | | |
|---|---|---|---|---|
| 4,387,355 A | * | 6/1983 | Uno et al. ................... | 333/195 |
| 4,456,847 A | * | 6/1984 | Minagawa et al. ...... | 310/313 R |
| 4,473,888 A | * | 9/1984 | Smith ........................ | 333/195 |
| 4,701,657 A | * | 10/1987 | Grassl ..................... | 310/313 C |
| 4,910,839 A | * | 3/1990 | Wright ....................... | 29/25.35 |
| 4,918,349 A | * | 4/1990 | Shiba et al. ............. | 310/313 C |
| 5,256,927 A | * | 10/1993 | Kato et al. ............... | 310/313 B |
| 5,793,146 A | * | 8/1998 | Wright .................... | 310/313 B |
| 5,818,310 A | | 10/1998 | Solie | |

FOREIGN PATENT DOCUMENTS

| EP | 0255263 | * | 7/1986 | ............ H03H/9/02 |
|---|---|---|---|---|
| EP | 0 255 263 | | 7/1987 | |

OTHER PUBLICATIONS

Morgan D P et al: " Low loss filters using group–type spudt transducers" Proceedings of the ultrasonics symposium, US, New York, IEEE, Bd.–Apr. 12, 1990, Seiten 31–35, XP000290030 Seite 31, rechte Spalte.
Ventura P et al:"A new concept in spudt design: The rspudt (resonant spudt)", Proceedings of the ultrasonics symposium, US, New York, IEEE Jan. 11, 1994, Seiten 1–6 XP00590526 ISBN: 0–7803–2013–1, Seite 1, rechts Spalte.

* cited by examiner

*Primary Examiner*—Thomas M. Dougherty
*Assistant Examiner*—Karen Beth Addison
(74) *Attorney, Agent, or Firm*—Fish & Richardson P.C.

(57) ABSTRACT

A transducer includes base cells each having a length $\lambda$, where $\lambda$ is a wavelength of a center frequency of the transducer. The base cells are arranged in a direction of propagation of a surface acoustic wave. The base cells include exciting base cells and reflecting base cells. The exciting base cells each have a same number of electrode fingers. Each base cell has a reflection portion. The reflection portion of each base cell has a same value mRo, where m is one of −2, −1, 0, 1, or 2 and Ro is a reference reflection. Each non-zero reflection portion in each base cell has a same phase position. Excitation and reflection in the transducer are equal in phase in one direction of propagation of the surface acoustic wave and opposite in phase in an opposite direction of propagation of the surface acoustic wave.

10 Claims, 1 Drawing Sheet a)

b)

c)

a) 
b) 
c)

a) 
b) 
c)

SURFACE WAVE CONVERTER WITH OPTIMIZED REFLECTION

CROSS-REFERENCE TO RELATED APPLICATIONS

This application claims priority to PCT Application No. PCT/DE01/00630, filed on Feb. 19, 2001, and to German Patent Application No. 100 10 089.9, filed on Mar. 2, 2000.

BACKGROUND

This invention relates to an interdigital transducer used to produce surface acoustic waves (SAW). Such an interdigital transducer is called a surface acoustic wave transducer, and is referred to hereinafter as simply a "transducer". A transducer of this type includes two comb-shaped electrodes, each called a current-collecting bar or bus bar, which comprise electrode fingers. Two such combined comb-shaped electrodes form the interdigital transducer. A surface acoustic wave filter can, for example, be made up of a piezoelectric substrate with two interdigital transducers that act as an input and an output transducer. The acoustic surface wave produced in the input transducer is converted back to an electrical signal in the output transducer. The path taken by the acoustic surface wave, which can, if necessary, be bounded on both sides of the transducers by reflectors, or can penetrate into them, is also called an acoustic track. The efficiency of the electroacoustic conversion is optimum at the center frequency. Through various design and circuit modifications, the filter is adjusted such that it has a good passband response over a desired bandwidth near its center frequency. Within this band, a filter should have as low an insertion loss as possible, i.e., a low loss when the surface wave is launched and transmitted. Signals lying outside this band should be dissipated in the filter.

A narrow band filter can, for example, be obtained by increasing the number of electrode fingers, so that a longer transducer is obtained.

In a standard finger transducer, the electrode fingers that are connected to different bus bars have a finger center separation of $\lambda/2$. In the conversion of a standard finger transducer to a split finger transducer, two split fingers arranged at a separation of $\lambda/4$ replace each electrode finger of the standard finger transducer. The two split fingers are inherently mechanically reflection-free, since the reflections of the two fingers cancel one another out. But, even in this case, problems can still occur with longer transducers, causing a split finger transducer not to be reflection-less due to non-zero electrical regeneration at the terminal impedance at the acoustic gates.

SUMMARY

An article by P. Dufilie and P. Ventura, entitled "Source Equalization for SPUDT Transducers" in IEEE Ultrasonics Symposium 1995, pp. 13–16, provides known rules for creating a transducer with distributed acoustic reflection, or a so-called DART transducer. A DART transducer having unidirectional characteristics is a SPUDT transducer (SINGLE PHASE UNIDIRECTIONAL TRANSDUCER). In this type of transducer, exciting and reflecting electrode fingers are different. A reflection-free pair of similar electrode fingers with a finger center separation of $\lambda/4$ is used for excitation. In a unit cell with length $\lambda$, there is also a reflecting electrode finger. By adjusting the width and exact position of the reflecting electrode transducer, the transducer reflection can be adjusted. In this manner, it is possible to model a transducer that has a desired reflection distributed over the transducer. This distributed reflection can be weighted.

The object of this invention is to provide a transducer with distributed excitation and reflection that has a high unidirectionality and symmetric electroacoustic conversion with respect to a center frequency.

This object is met, according to the invention, by a transducer according to claim 1. Advantageous embodiments of the invention can be found in the dependent claims.

Starting from a transducer having known DART cells, the transducer according to the invention also has a distributed reflection, but does not have the limitations of the DART cell. Whereas the latter requires a strict separation of the exciting electrode finger pair and the reflector fingers, the transducer of the present invention does not require such a strict separation. A transducer according to the invention is built from a number "n" of base cells, arranged one after the other in the direction of propagation of a surface wave. Altogether the cells have an approximate length of $\lambda$, which is the center frequency of the transducer. The transducer can be split up into exciting and reflecting base cells, in which the reflection portion has only specific values $m \cdot R_o$, where "m" can have values −2, −1, 0, 1, or 2, and where $R_o$ is a reference reflection. Each reflection portion that is not 0 in value has the same phase position $\phi_0$. Phase position and excitation strength are identical in all exciting base cells, as is the number of exciting fingers. The phase relationship between excitation and reflection results in unidirectional behavior in the transducer, with phase equality being maintained in one preferential direction, and phase opposition being maintained in the opposite direction.

The subject transducer is no longer strictly subdivided into exciting and reflecting fingers. Instead, exciting fingers also contribute a reflection portion that is optimized to the desired phase position and strength by varying the finger width and finger position. This also increases the unidirectionality of the transducer, which leads to a decreased insertion loss, a longer impulse response, and steeper sides of the band pass of the band pass curve in a filter containing a transducer of this type.

All of the exciting base cells of the transducer can each have exactly one electrode finger individually connected to a bus bar as the exciting electrode finger, thus forming single finger cells, or so-called EWC cells. Dual finger cells are also possible. In dual finger cells, all exciting base cells have one group of two electrode fingers each, connected to a common bus bar, as exciting electrode fingers. In these cells, the exciting electrode fingers in each group have different finger widths and a finger center separation that always differs from $\lambda/4$. Advantageously, the dual finger cells produce a relatively large excitation per exciting base cell. In the single finger cells, on the other hand, in most cases a larger reflection portion of the exciting base cell can be maintained as a function of the minimal structure width. Finally, the transducer is preferred to have only one type of exciting base cell, since all exciting cells have the same excitation strength. This is the case for both single and dual finger cells.

One excitation center and/or one reflection center can be determined in each base cell of the transducer. In base cells according to the invention or a transducer according to the invention, the separation of the excitation centers from the reflection centers is $3\lambda/8$. This separation applies to all base cells that provide excitation and reflection portions.

In the transducer, the reflection strength can be maximized in the reflecting base cells. This does not mean that all cells have maximum reflection, but that the reference reflection strength $R_o$ is set to a maximum value to which all base cells can correspond with the exception of the non-reflecting cells. The reflection strength of the base cell that has the lowest reflection strength after optimizing all base cells to maximum reflection strength then serves as reference $R_o$.

In another embodiment of the transducer, the finger widths and the separations of the electrode fingers continuously increase or decrease in the transverse direction (perpendicular to the direction of propagation of the surface wave). This type of modification increases the bandwidth of a transducer and thus the bandwidth of a filter in which the transducer is used.

In another embodiment of the invention, the transducer is designed to be focusing and has electrode fingers with bent edges. A transducer of this type effects a reduction in leakage losses when used as an input transducer in a surface acoustic wave filter. By being focused, even those surface waves that in an input transducer with straight electrode fingers would no longer reach the output transducer make their way to the receiving or output transducer. This also lowers the insertion loss of the transducer and the filter.

In each base cell, in general, all finger widths and all finger separations of the electrode fingers are different. This means that within a base cell a specific maximum finger width or a specific maximum finger separation occurs only once.

Due to the advantageous properties of the transducer, it may be used in an IF filter that has a low insertion loss and that has a longer impulse response due to the additional resonance spaces created.

A method to determine optimal transducer geometries is described in more detail below with respect to an exemplary embodiment and its associated figures. These show:

DETAILED DESCRIPTION

The precise determination of the finger geometries, in particular the finger widths and the finger separations, is made by formulating a solvable optimization task. Optimization procedures for transducers are known, but are subject to limitations such that the cells to be constructed have lesser degrees of freedom than available geometric widths. For an optimization procedure to produce transducers according to the invention, the problem can be generalized so that restrictions that apply to previous optimization procedures, in particular the fixed relationships between finger widths and positions, no longer apply. Until now, weighting the reflection of a cell was only possible by adjusting the metallization height. According to the invention, it is now possible to continuously vary the widths of the reflection finger or fingers.

The non-exciting geometries are directly formed from the geometries with excitation by leaving out the overlap, e. g., by modifying the finger connection sequence. Starting geometries of the base cells for the optimization task are selected from known single and dual finger cells.

Figure 1:
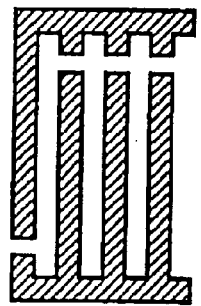
FIGS. 1a through 1c show three different approaches for single finger cells.
Figure 1:
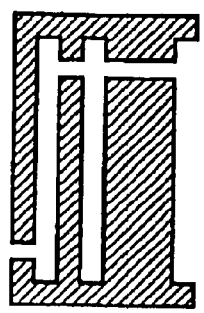
Figure 1:
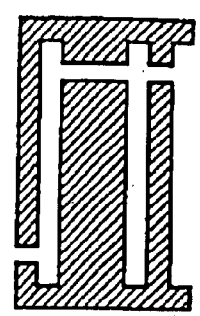

FIGS. 1a through c show three different approaches for single finger cells, in which there is only one electrode finger at each signal-carrying bus bar. The single finger cells can be comprised of three or four electrode fingers.

FIG. 1a shows a single finger cell without reflection that can be used as an output point. The single finger cell has a regular $\lambda/8$ finger arrangement in a $\lambda/2$ grid and is reflectionless when electrically short-circuited.

FIG. 1b shows a single finger cell with positive reflection that has an additional reflecting electrode finger with a width $3\lambda/8$ in addition to an electrode finger pair with finger width and finger separation=$\lambda/8$.

FIG. 1c shows how a single finger cell with negative reflection arises from a cell by exchanging two electrode fingers. The phase difference of the reflection between cells with positive reflection and cells with negative reflection is 90° such that the phase difference of reflection at the ends of this single finger transducer is 180°.

Figure 2:
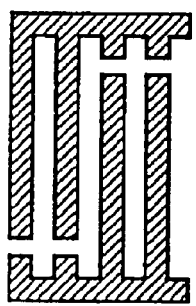
FIGS. 2a through c show different types of dual finger cells.
Figure 2:
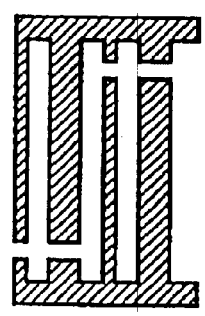
Figure 2:
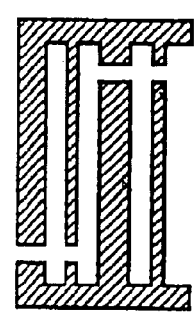

FIGS. 2a through c show different types of dual finger cells, in which two electrode fingers are connected to signal-carrying bus bars.

FIG. 2a again shows a regular $\lambda/8$ finger arrangement that is reflection-free.

FIG. 2b shows a dual finger cell with positive reflection.

FIG. 2c shows a dual finger cell with negative reflection.

The cited, known single and dual finger cells are used as a starting point for the optimization process. If a transducer is electrically connected, i. e., is connected to an external load, a regeneration signal arises due to acoustic electrical feedback of the surface wave to the electrode fingers. This signal influences the behavior of the transducer. A transducer that is reflection-free under load can be optimized such that the reflected portions of the wave can exactly cancel the regeneration signal. To accomplish this, a suitable phase relationship and corresponding amplitude ratio must be produced. However, other optimization goals are also conceivable for transducers according to the invention for specific applications.

In the optimization process to determine a final transducer geometry, all of the foregoing points are taken into account and lead, in the end, to a transducer in which the electrode fingers have different finger widths and finger separations within its base cells. This is also a result of iterative minimization of the phase error that is required after optimization.

Figure 3:
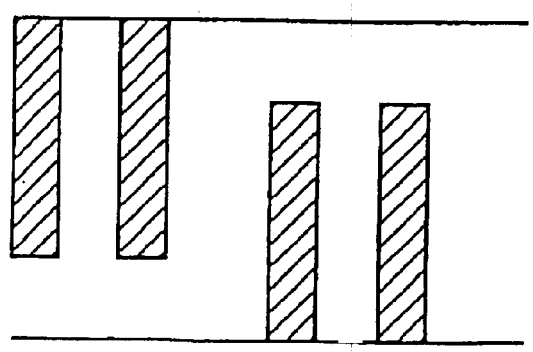
FIG. 3 shows an exemplary base cell according to the invention.

FIG. 3 shows a reflecting dual finger cell of a transducer resulting from an optimization process. Each cell has two dual fingers with a finger width of $0.0829*\lambda$ and $0.1004*\lambda$, respectively, at a finger separation of $0.1229*\lambda$. A considerable improvement in the transfer function has been shown with the transducer compared to known geometries. The attenuation is clearly increased, the sides are steeper and the insertion loss is reduced.

What is claimed is:

1. A transducer comprising:
base cells each having a length $\lambda$, where $\lambda$ is a wavelength corresponding to a center frequency of the transducer, the base cells being arranged in a direction of propagation of a surface acoustic wave, the base cells including exciting base cells, the base cells including an excitation portion and a reflection portion, the excitation portion being non-zero for exciting base cells, the reflection portion of each base cell having a strength $mR_0$, where m is one of −2, −1, 0, 1, or 2 and $R_0$ is a reference reflection;
wherein the base cells include electrode fingers, a width of the electrode fingers is not a multiple of $\lambda/16$, and a separation between adjacent electrode fingers is not a multiple of $\lambda/8$;

wherein, in the direction of propagation, a non-zero reflection portion in each base cell has a same phase position $\phi \pm \pi n$, where n is an integer greater than zero;

wherein centers of excitations of base cells having a same sign are separated by $2\pi n$ and centers of excitations of base cells having different signs are separated by $(2n-1)\pi$, and wherein surface acoustic waves excited and reflected in at least one base cell are equal in phase in the direction of propagation and opposite in phase in a direction that is opposite to the direction of propagation.

2. The transducer according to claim 1 wherein in at least one base cell, one electrode finger is connected to a first bus bar and all other electrode fingers are connected to a second bus bar, the one electrode finger having a width that is not $\lambda/8$, the one electrode finger having a separation from an adjacent electrode finger that is not $\lambda/4$ or $3\lambda/8$.

3. The transducer according to claim 1 wherein groups of two electrode fingers are connected to a common bus bar, one group each per exciting base cell, and wherein electrode fingers in a group of two electrode fingers each have a different finger width that is not $\lambda/16$ or $3\lambda/16$ and a finger center separation that is not $\lambda 4$.

4. The transducer according to claim 2 wherein, in the exciting base cells, a separation between excitation centers and reflection centers is $3\lambda/8$.

5. A transducer according to claim 1 wherein electrode finger widths and separations increase in transverse direction.

6. A transducer according to claim 1 wherein the electrode fingers have bent edges.

7. A transducer according to claim 1 wherein electrode finger widths and separations are different in each base cell.

8. An IF filter with low insertion loss and long impulse response, which includes the transducer of claim 1.

9. The transducer of claim 1 wherein excitations of all exciting base cells have a substantially identical strength.

10. The transducer of claim 1 wherein a number of electrode fingers connected to first and second bus bars is identical for all base cells having a non-zero excitation portion.

* * * * *